United States Patent [19]
Prickett, Jr.

[11] Patent Number: 5,398,203
[45] Date of Patent: Mar. 14, 1995

[54] MEMORY PROGRAMMING LOAD-LINE CIRCUIT WITH DUAL SLOPE I-V CURVE

[75] Inventor: Bruce Prickett, Jr., Fremont, Calif.

[73] Assignee: Cypress Semiconductor Corporation, San Jose, Calif.

[21] Appl. No.: 115,217

[22] Filed: Sep. 1, 1993

[51] Int. Cl.6 .............................................. G11C 11/34
[52] U.S. Cl. .................................. 365/185; 365/189.09
[58] Field of Search ................... 365/185, 189.09, 226

[56] References Cited

U.S. PATENT DOCUMENTS

| | | | |
|---|---|---|---|
| 4,999,813 | 3/1991 | Ohtsuka et al. | 365/201 |
| 5,245,574 | 9/1993 | Frary et al. | 365/189.09 |

Primary Examiner—Eugene R. LaRoche
Assistant Examiner—Amir Zarabian
Attorney, Agent, or Firm—Blakely, Sokoloff, Taylor & Zafman

[57] ABSTRACT

A non-volatile memory device is described. The memory device includes a memory array and current regulating circuitry coupled to the memory array. The memory array includes a first memory cell coupled to a first bit line and a second memory cell coupled to a second bit line such that the first memory cell receives a first current during programming of the first memory cell and the second memory cell receives a second current during programming of the second memory cell. The current regulating circuitry regulates the first and second currents during programming of the first and second memory cells such that when the first cell is being programmed and the second cell is not being programmed, the circuitry limits the first current flowing through the first bit line for programming the first memory cell to be substantially equivalent to the first current if the first and second memory cells are being programmed substantially at the same time. The current regulating circuitry allows the current-voltage characteristic of the programming load line to be controlled such that the characteristic, represented as a curve, may have two slopes and the shape and slopes of the curve may be adjusted independently.

17 Claims, 9 Drawing Sheets

MEMORY PROGRAMMING LOAD-LINE CIRCUIT WITH DUAL SLOPE I-V CURVE

FIELD OF THE INVENTION

The present invention pertains to the field of memories, particularly in integrated circuit form. More particularly, this invention relates to circuitry and a method for providing a programming current to the memory cells being programmed. The programming current to each memory cell being programmed is substantially independent of the number of bits being programmed.

BACKGROUND OF THE INVENTION

One type of prior non-volatile integrated circuit memory is the erasable programmable read-only memory ("EPROM"). EPROMs frequently use memory cells that have electrically isolated gates (floating gates). A FAMOS (Floating gate Avalanche injection Metal Oxide Semiconductor) device is a typical example of an EPROM memory cell. Information is stored in the memory cells in the form of charge on the floating gates. The EPROM is programmed by placing a charge on the floating gates. The EPROM can be programmed by a user, and once programmed, the EPROM retains its data until erased. Other memory devices such as Flash EEPROMs (Electrically Erasable Programmable Read Only Memory) are also user programmable. Flash EEPROMs are also programmed by electrically injecting a charge onto the floating gates.

The EPROM comprises memory cells logically organized by rows and columns. Typically, the rows represent word lines and the columns represent bit lines. By selecting the appropriate word line and bit line, each individual cell may be programmed or read. During the programming operation a given memory cell or cells are selected for programming, then a voltage is applied to the control gate of each memory device (e.g. a FAMOS device). A programming voltage is applied to the bit line of each selected memory cell. The programming voltage generates a programming current flowing through the selected bit line, thus programming the memory cell or cells. Due to physical and functional limitations of the memory, the programming current in each bit line must be controlled within certain operating parameters. These physical and functional limitations define a "box" within which the current through the memory cell and the voltage across the source/drain current path of the memory cell (current-voltage characteristic curve) must remain in order to ensure proper programming of the memory cells.

Prior art memories achieved this by incorporating a linear current limiting device in each bit line or for a group of bit lines. The voltage drop across a linear current limiting device is directly proportional to the current through the device. An example of a linear current limiting device would be a resistor. The current-voltage characteristic utilizing a resistor would essentially be a line. The slope of the current-voltage characteristic could be varied by selecting resistors with different values. This linear current-voltage characteristic was often referred to as a "load-line", and this term is often used even when the current-voltage characteristic is not linear. It is used as a general term for the current-voltage characteristic of EPROM programming circuits.

One disadvantage of this prior art memory is that the memory cell could only be operated over a narrow voltage or narrow current range due to the linear nature of the current-voltage characteristic.

Another disadvantage of this prior art memory is that the current-voltage characteristic would shift depending upon how many other memory cells were being programmed. Thus although the slope of the characteristic could be varied, the choices were limited due to having to account for this shifting. Connecting a group of bit lines to draw current through the resistor causes the current through the bit lines to drop when several bit lines are being used to program memory devices. Compensating for this by decreasing the resistor value will cause the current supplied to a single bit line to increase dramatically when no other bit lines are being programmed.

Improved prior art memories substituted a non-linear current limiting device so that the bit lines could be subjected to a greater range of voltages and yet the memory cells would still be operating within desired operational parameters. The current through a non-linear current limiting device is not directly proportional to a voltage across the device.

One example of a current limiting device having a non-linear current-voltage characteristic is a metal oxide semiconductor field effect transistor (MOSFET). A MOSFET has a drain terminal, a source terminal and a gate terminal. When a MOSFET is operating in the linear mode the drain to source current $I_{DS}$ is essentially directly proportional to the voltage $V_{DS}$ measured between the drain and the source terminals. When a MOSFET is operating in the saturation mode, the current $I_{DS}$ is substantially independent of the voltage $V_{DS}$. Whether the MOSFET is operating in the linear or saturation mode is controlled by the voltage applied between the gate and source terminals ($V_{GS}$). For an n-channel MOSFET, when $V_{DS} > V_{GS} - V_t$ the transistor is operating in the saturation mode. For an n-channel MOSFET, when $V_{DS} < V_{GS} - V_t$ the transistor is operating in the linear mode. The voltage $V_t$ is often called the threshold voltage.

One disadvantage of this prior art memory is that the current utilized by a given bit line during a programming operation depends on how many other memory cells are being simultaneously programmed. This means that the bit lines must be insensitive to a current which varies a great deal, depending upon how many other cells are being simultaneously programmed. Furthermore, complicated feedback circuits designed to regulate the current in each bit line are undesirable due to the amount of space required for implementation on the integrated circuit containing the memory.

In addition, the memory designer was typically forced to give up desired functionality such as programming speed because of physical limitations such as substrate current. As transistor technologies advance toward smaller dimensions and thinner oxides, the constraints set by programming speed, maximum bit line voltage, and maximum current per bit have become more restrictive, requiring programming load lines that are well regulated over a range of process, voltage, and numbers of bit lines being programmed.

SUMMARY AND OBJECTS OF THE INVENTION

In view of the limitations of known circuitry and methods, one of the objectives of the present invention is to provide circuitry and a method for decreasing the sensitivity of a bit line current to the number of memory cells being programmed simultaneously in a non-volatile memory array.

One advantage of such a circuit is that smaller memory cells may be constructed.

Another advantage of such a circuit is that the number of memory cells being programmed simultaneously can be substantially increased or decreased without exceeding the operational limits of each memory cell.

Another advantage of such a circuit is that it reduces the likelihood of excessive substrate currents which would otherwise result in "latch up" of the memory cell or in the peripheral circuits.

Another advantage of such a circuit is that it reduces the drain disturbance voltage on other memory cells during a programming operation using an adjustable voltage limit.

Another object of the invention is to provide a circuit which takes up a relatively small amount of space on an integrated circuit.

An advantage of such a circuit is that its size permits incorporation into present memory circuitry without reducing the total number of memory cells in a memory array due to space requirements.

Another object of the invention is to provide a circuit which provides a dual slope current-voltage characteristic curve for a memory cell during a programming operation where the two slopes are separately adjustable.

One advantage of such a circuit is that it permits programming the memory cell over a greater range of programming voltage and programming current without exceeding the operational limits of the memory cell being programmed.

A non-volatile memory device is described. The memory device includes a memory array and current regulating circuitry coupled to the memory array. The memory array includes a first memory cell coupled to a first bit line and a second memory cell coupled to a second bit line such that the first memory cell receives a first current during programming of the first memory cell and the second memory cell receives a second current during programming of the second memory cell. The current regulating circuitry regulates the first and second currents during programming of the first and second memory cells such that when the first cell is being programmed and the second cell is not being programmed, the circuitry limits the first current flowing through the first bit line for programming the first memory cell to be substantially equivalent to the first current if the first and second memory cells are being programmed substantially at the same time.

Other objects features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

An EPROM of a preferred embodiment of the present invention includes a memory array logically organized into columns and rows.

The memory array includes word lines and bit lines. Select transistors couple, in the conventional manner, the memory cells to be programmed to a programming voltage via a selected bit line which is coupled to the programming voltage source.

One type of memory cell used in EPROMs is the floating gate avalanche injection metal oxide semiconductor (FAMOS) transistor. The FAMOS transistor has a control gate terminal, a floating gate, a source terminal and a drain terminal. A channel connects the source terminal and the drain terminal. The floating gate is disposed between the channel and a control gate which is coupled to the control gate terminal. The floating gate is electrically isolated from the channel and from the control gate. Isolation is achieved by using a thin insulative layer. Programming is accomplished by creating an avalanche breakdown condition at the drain-to-channel junction. When this happens, avalanche breakdown occurs and electrons are injected through the insulation onto the floating gate. A presently preferred embodiment of an EPROM memory cell utilizes an n-channel FAMOS transistor. The use of FAMOS transistors in memory circuitry is well-known in the art. It will be appreciated that other memory devices, such as Flash EEPROMs (which can be electrically programmed, usually by the user) may also be used with the present invention.

Figure 1:
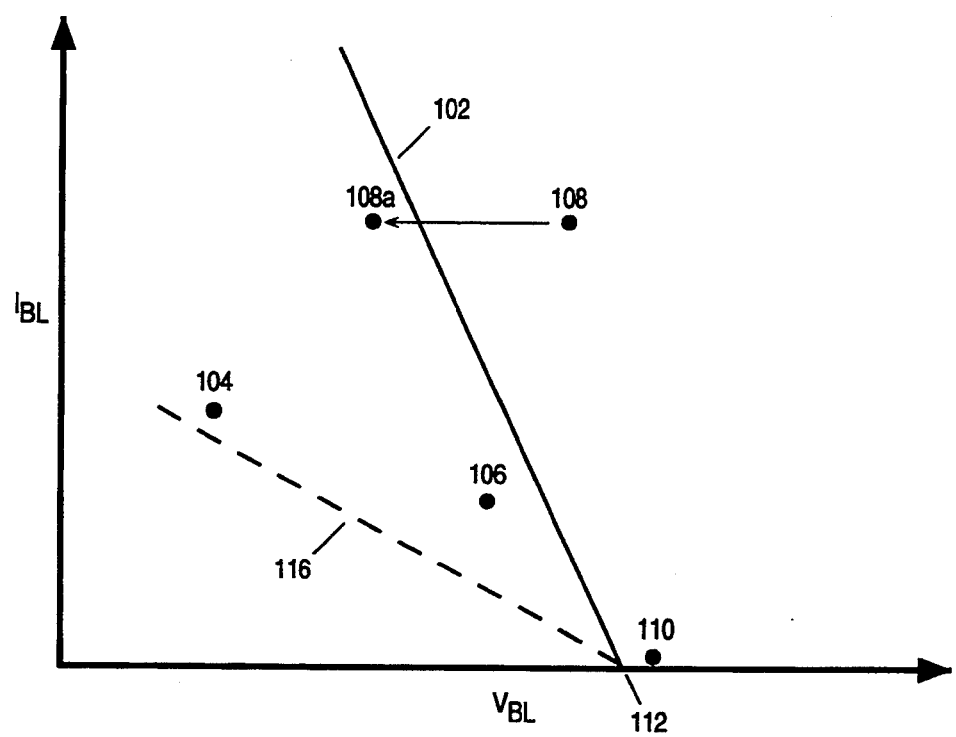
FIG. 1 depicts typical operating constraints and a current-voltage characteristic for a memory cell utilizing a prior art linear current limiting circuitry during the programming operation.

FIG. 1 illustrates some of the operational constraints imposed on memory programming circuitry. The y-axis represents the bit line current passing through the memory cell (e.g. cell 230 shown in FIG. 2) being programmed. The x-axis represents the voltage measured across the memory cell (typically the drain to source voltage on a FAMOS transistor) during programming. FIG. 1 also illustrates the current-voltage characteristic applied to a memory cell on a bit line during a programming operation where a linear current limiting device is used. The slope of the current-voltage characteristic line 102 determines the range of current and voltages available to the memory cell being programmed. Although the slope of the line is variable, the operating ranges must remain at least within the boundaries defined by the constraints 104, 106, 108, and 110.

If a memory cell voltage falls below a functionality constraint 104, the electric fields in the memory cell may drop thus inhibiting programming. Thus the functionality constraint 104 provides one corner of the box within which the memory cell must operate.

One performance objective of a memory array is to permit fast programming speed. Therefore if the current-voltage characteristic curve drops below a programming speed constraint 106, the memory will not perform as desired. A second current-voltage characteristic line 116 is shown as an example of a programming circuit which provides too little current for programming. Programming will take longer than is desirable when insufficient current is being passed through the memory cell's bit line. Thus a second corner of the box within which programming of the memory cell must operate is defined.

If the current exceeds a substrate threshold constraint 108, the memory cell will be subject to latching up and thus becoming non-functional. The substrate threshold constraint 108 provides yet another box corner.

Finally, if the voltage exceeds a drain disturb threshold 110, then effects such as "drain disturb" will inhibit proper operation of the memory cell ("drain disturb" is the leakage of charge from the floating gates of memory cells that share the same bit line as the cell being programmed). Thus the drain disturb threshold 110 defines another corner of the box within which programming of the memory cell must operate.

For reliable programming, the load-line must pass above and to the right of constraints 104 and 106, and below and to the left of constraints 108 and 110. This ensures that enough current is available without exceeding the maximum current or voltage. Although the slope of a linear load line such as line 102 may be adjusted by setting the resistance, a linear load-line may not be able to satisfy all the constraints. Depending on the transistor technology, the substrate current constraint may be set at a lower voltage than the fast programming constraint 106. Constraint 108a is an example of a substrate current constraint that is at too low a voltage for a linear load-line. This situation often arises in advanced EPROM technologies, and requires a load-line that is non-linear.

Figure 2:
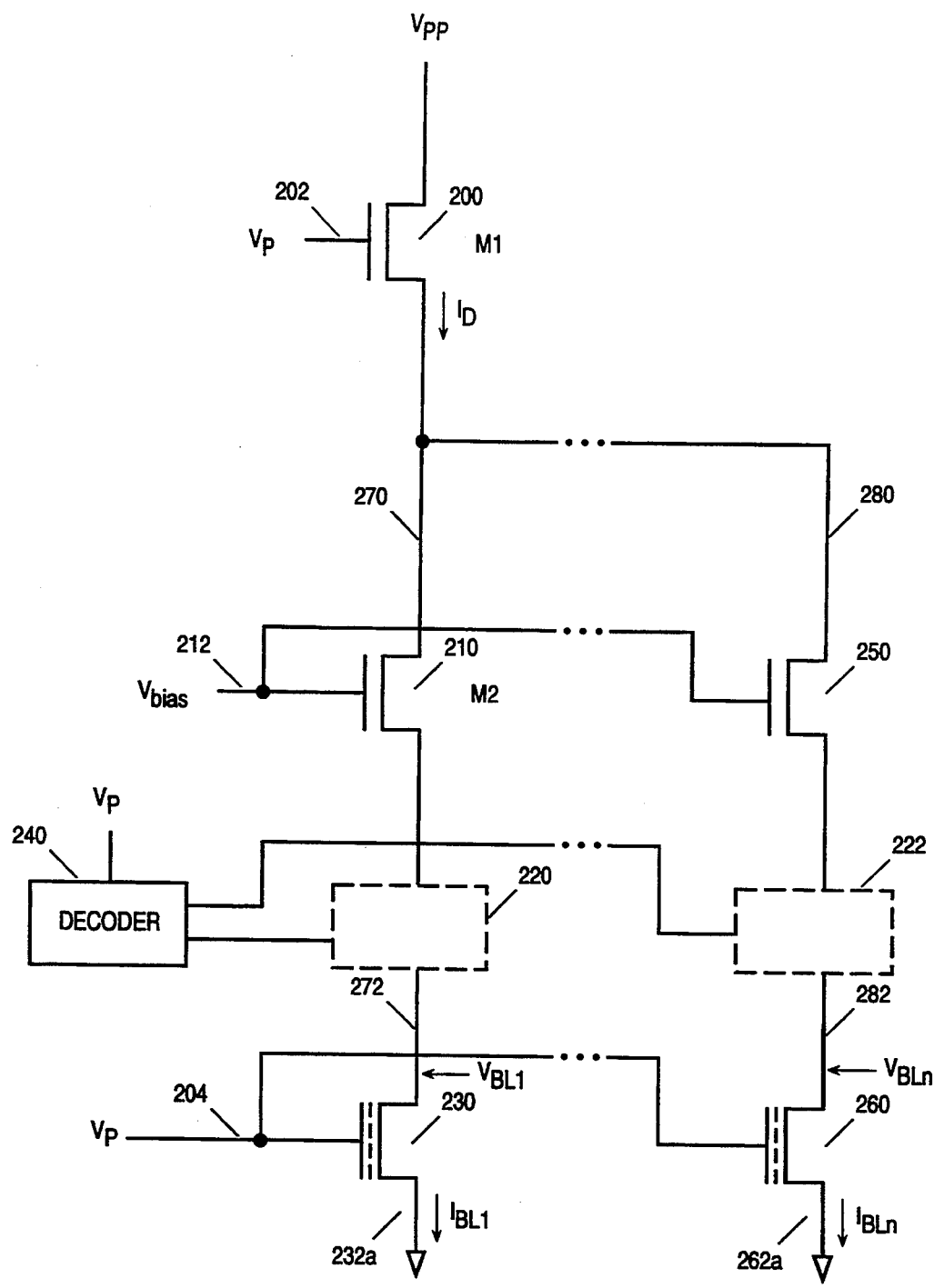
FIG. 2 is a schematic of a prior art circuitry which utilizes a non-linear current-voltage characteristic during the memory programming operation.

FIG. 2 illustrates one embodiment of a prior art circuitry which possesses a non-linear current-voltage characteristic curve during a memory programming operation.

Transistor M1 200 limits the current $I_D$ available to all the devices on the bit lines coupled to $V_{pp}$ (shown in FIG. 2) during the programming operation. The programming circuitry may consist of multiple programming load line circuits 270 and 280. One programming load line circuit 270 may have multiple bit lines which are coupled to it via a selection means 220. In this embodiment only one bit line 272 is selected for programming by coupling it to a programming load line 270 via a selection means 220 during a programming operation. The selected bit line 272 is coupled to one memory cell 230 (shown in this example as a FAMOS EPROM device). Thus there is at most one bit line selected for programming for each programming load line.

Although the memory cells 230 and 260 in FIG. 2 are shown as FAMOS transistors with their respective sources 232a and 262a terminated at a ground potential, the sources 232a and 262a may be coupled to other memory circuitry.

The operation of the circuit shown in FIG. 2 is as follows. During a programming operation a programming voltage $V_{pp}$ is applied to the memory array. The total current $I_D$ to all the memory cells on the integrated circuit is limited by transistor M1 200. Transistor M1 is a MOSFET which is operating in the linear mode. This is ensured by application of a voltage $V_p$ to the gate 202 of transistor M1 200. $V_p$ is chosen such that $V_p - V_{tM1} > V_{pp}$ where $V_{tM1}$ is the threshold voltage for transistor M1 200. Up to n memory cells (shown as a first memory cell 230, and an nth memory cell 260 in FIG. 2) may be programmed at any given time. However, in a typical prior art integrated circuit there is at most one selected bit line containing a memory cell to be programmed for each programming load circuit. Two programming load circuits, identified as 270 and 280, are shown in FIG. 2. The selected memory cell 230 is coupled to a bit line 272 which is selected by a selection means 220. The selection means in one embodiment typically consists of a MOSFET which can pass a programming current $I_{BL}$ to the memory cell 230 when a voltage $V_p$ is applied to the gate of the MOSFET in the selection means. A decoder 240 is typically used to couple the voltage V p to a selected selection means 220. The current available for any one programming load line depends on how many other memory cells on other programming load lines are being programmed.

Figure 3:
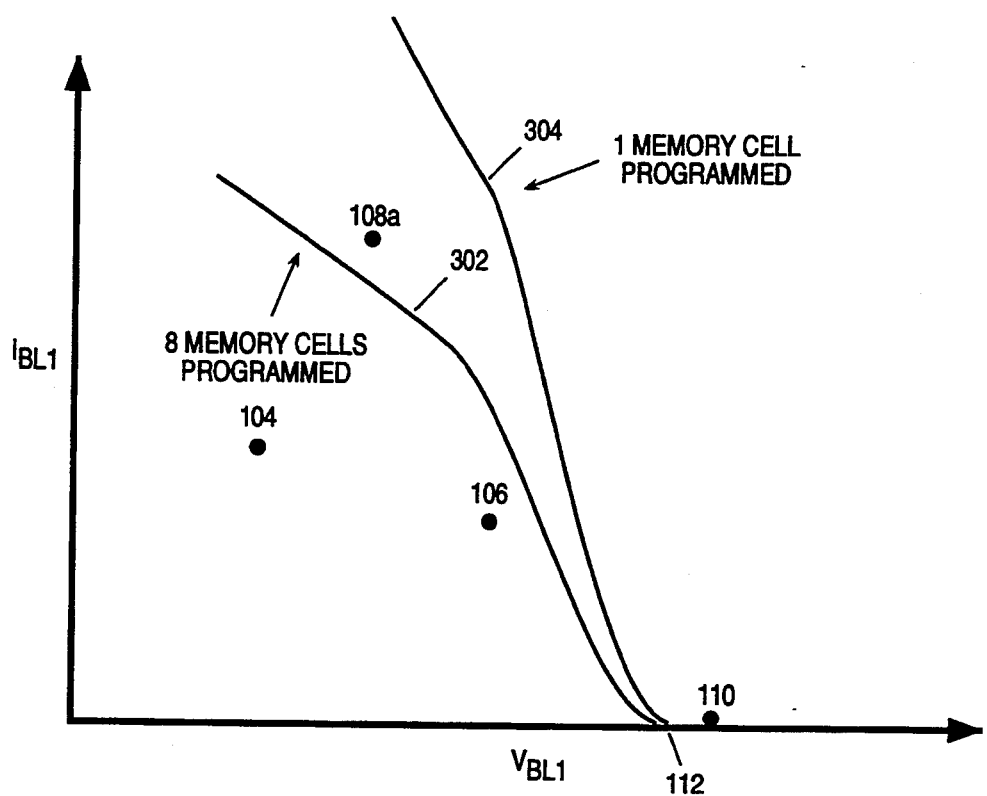
FIG. 3 illustrates typical operating constraints and a non-linear current-voltage characteristic during a memory programming operation for the prior art circuitry when one cell is being programmed as well as the characteristic for the same memory cell when other cells are being programmed.

The current in a selected programming load line 270 passes through transistor M2 210. Transistor M2 210 is a MOSFET. The operating characteristic of transistor M2 is set by applying a bias voltage $V_{bias}$ to the gate 212 of transistor M2. $V_{bias}$ is chosen such that transistor M2 operates in the saturation mode. When operating in the saturation mode, transistor M2 210 serves to limit the maximum voltage on the bit line. FIG. 3 illustrates the current voltage characteristic 302 for a programming load line circuit utilizing the non-linear device M2.

By utilizing the transistor M2 which provides a non-linear current-voltage characteristic 302, the memory cell can operate over a wider range of voltage and current because the non-linear curve permits operation within the box defined by the operating constraints 104, 106, 108, and 110. Although this provides an improvement over the prior art, the characteristic curve changes depending upon how many memory cells are being programmed. FIG. 3 illustrates the difference in the characteristic current-voltage curve for one memory cell being programmed 304 and the characteristic curve for eight memory cells being programmed 302. While load-line 302 meets all the constraints when 8 memory cells are being programmed, the load-line 304 exceeds the substrate current constraint 108a when only a single memory cell is being programmed. This is because the current from device M1 200 is not divided among eight memory cells. If the constraint is determined by the total substrate current that a circuit can tolerate, then it may be acceptable to exceed constraint 108a on a single bit. However, if constraint 108a is defined by constraints for individual transistors in the programming circuits or in the array, it may be critical to meet constraint 108a regardless of how may bits are being programmed. In this case, the load-line characteristic cannot be allowed to vary substantially with the number of memory cells being programmed.

Figure 4:
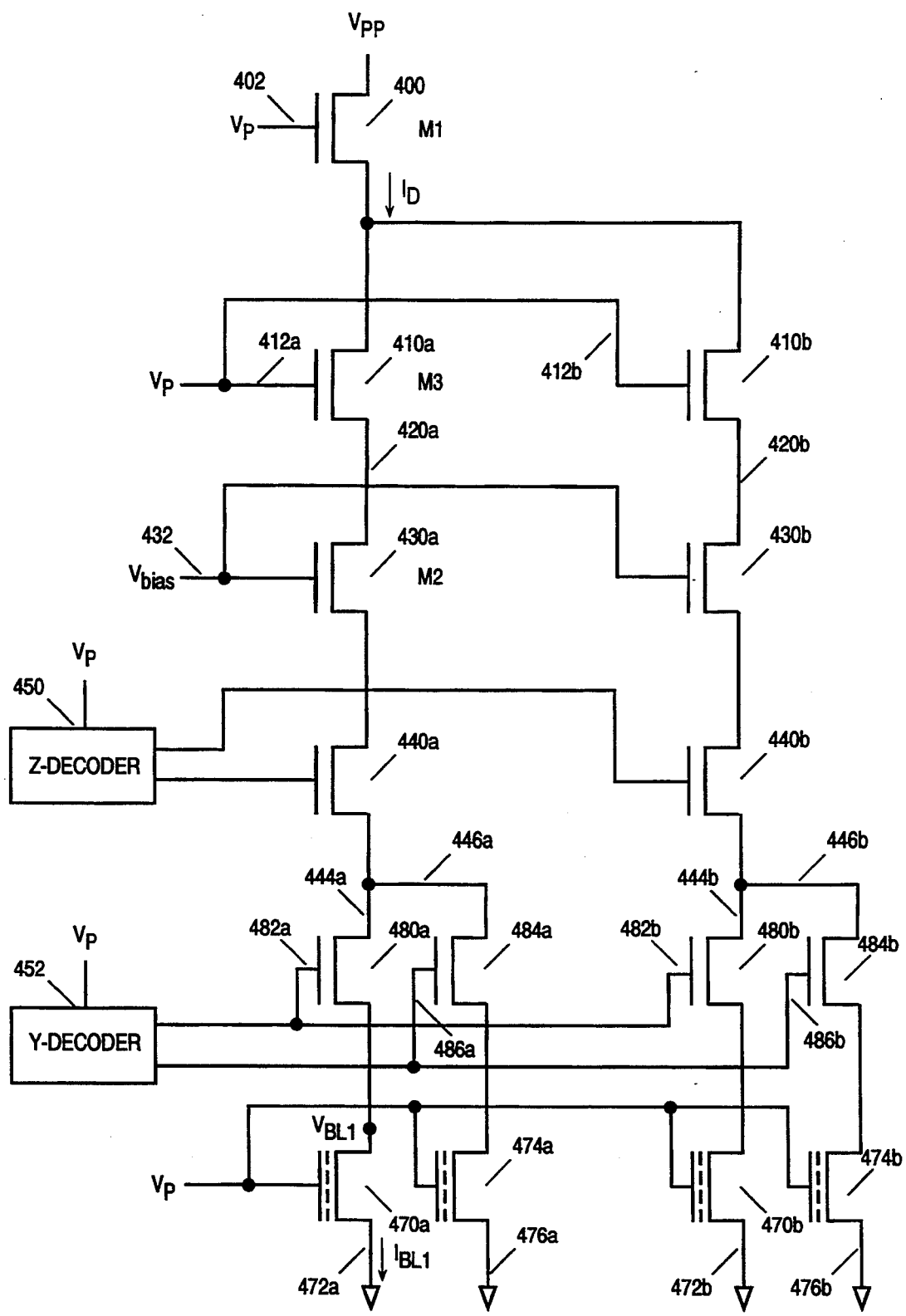
FIG. 4 is a schematic indicating one embodiment of the present invention.

FIG. 4 is a schematic showing one embodiment of the present invention. In the preferred embodiment, each programming load line 420a and 420b is selectively coupled to one or more bit lines 444a, 446a, 444b, and 446b. Transistors 410a and 410b have been inserted in the programming load line circuits 420a and 420b between the programming voltage source $V_{pp}$ and the voltage limiting transistors 430a and 430b. Additionally, the selection means 220 and 222 of FIG. 2 have been implemented by selection transistors 440a, 480a, 484a, 440b, 480b, and 484b. The decoder 240 of FIG. 2 is embodied in the Z 450 and Y 452 decoders. Although the memory cells 470a, 474a, 470b and 474b in FIG. 4 are shown as FAMOS transistors with their respective sources 472a, 476a, 472b, and 476b terminated at a ground potential, the sources 472a, 476a, 472b, and 476b may be coupled to other conventional memory circuitry.

$V_{pp}$ is typically $+12.5 \pm 0.5$ volts and is provided from a pin or pad on the integrated circuit containing the memory cell array. $V_p$ is typically $+15$ volts and it is generated within the integrated circuit. Transistors M1 400, M2 430a, and M3 410a are preferably n-channel MOSFETs. The transistor M1 400 is used to couple the voltage source (e.g. $V_{pp}$) to transistors 410a and 410b. In the preferred embodiment transistor M1 400 has a gate width of 1000 microns and gate length (the linear channel distance from the source to the drain) of 3 microns. The relatively large width of M1 400 will permit multiple instances of the programming load line circuitry shown. Moreover, the gate width-to-length ratio ensures that M1 will have a small channel resistance and can supply the programming current needs for all memory devices on the integrated circuit. Transistor M2 430a preferably has a gate width of 100 microns and a gate length of 2 microns. Transistor M3 410a preferably has a gate width of 10 microns and a gate length of 4.5 microns. Memory cells 470a, 474a, 470b and 474b are as small as functionally possible according to the available processing technology. The Z-decoder select gate transistors 440a and 440b and the Y-decoder select gate transistors 480a, 484a, 480b and 484b may be implemented in the conventional sizes for select devices in memory integrated circuits.

In this embodiment, the Z decoder 450 selects one or more programming load line circuits 420a and 420b by coupling $V_p$ to the gates of select transistors 440a and 440b. The Y decoder 452 selects at most one bit line of 444a, 446a, 444b and 446b for each of the programming load line circuits 420a and 420b.

In circuit 420a, transistor M3 410a serves in conjunction with transistor M2 430a to better regulate the current $I_{BL1}$ (shown in FIG. 4) to a selected memory cell 470a independently of how many other memory cells are being programmed on the same integrated circuit containing other memory cells. Transistor M3 410a and its equivalent 410b in the other programming load line 420b operate in the linear mode. Operation in the linear mode is ensured by coupling the gates 412a and 412b of transistor M3 410a and its equivalent 410b in the other programming load line 420b to $V_p$. Transistor M2 430a acts to limit the voltage $V_{BL1}$ supplied to memory cell 470a.

Figure 5:
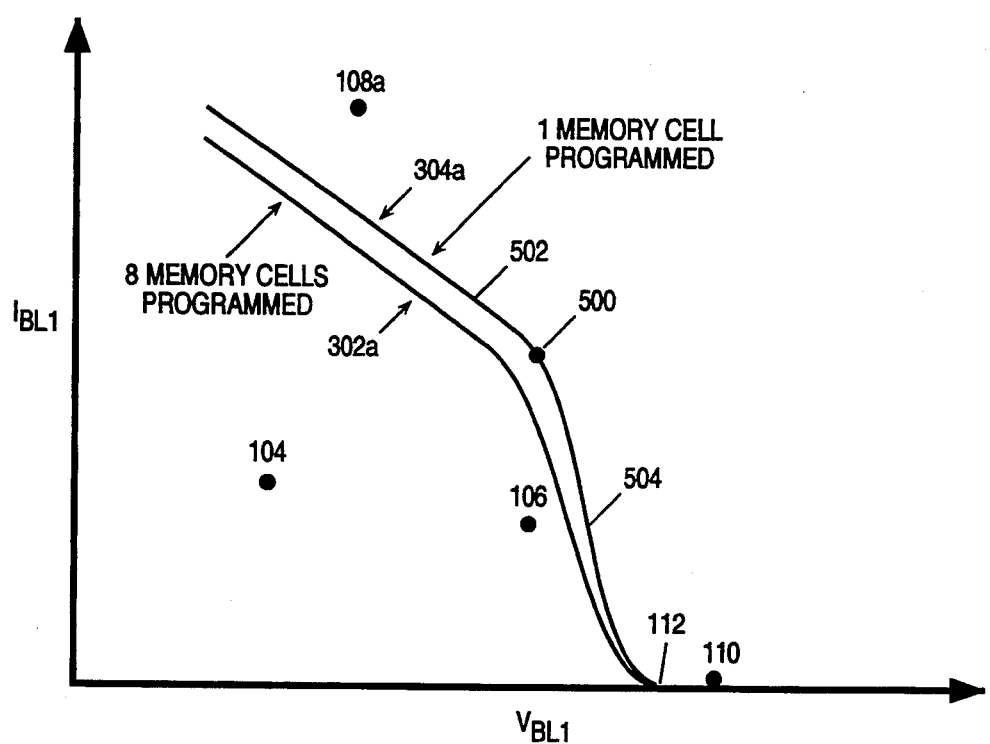
FIG. 5 illustrates typical operating constraints and the non-linear current-voltage characteristic during a memory programming operation for one embodiment of the current invention when one cell is being programmed as well as the characteristic for the same memory cell when several cells are being programmed.

FIG. 5 illustrates the improved current-voltage characteristic for the programming circuitry of the present invention, such as the circuitry shown in FIG. 4. The x-axis and the y-axis are the same as in FIG. 1, where the memory cell is cell 470a of FIG. 4. The current in a selected bit line is substantially independent of how many other memory cells are being programmed. Thus the current-voltage characteristic curve 304a shows the current-voltage characteristic provided by a bit line, such as bit line 444a, when only a memory cell associated with that bit line (such as cell 470a) is being programmed and it closely follows the current-voltage characteristic curve 302a provided by the same bit line 444a when, for example, eight memory cells (including the same memory cell 470a) are being programmed.

Note that the characteristic curves 302a and 304a of FIG. 5 each effectively have two slopes. For example, the characteristic curve for one-bit being programmed 304a has an upper region 502 and a lower region 504. The slope of the characteristic curve in each region is substantially constant resulting in a characteristic curve which is piecewise linear. Furthermore, the slope of the characteristic curve 304a in the upper region 502 is not the same as the slope of the curve in the lower region 504, thus giving rise to a dual slope feature for the current-voltage characteristic curve during a memory programming operation. The slope of each section and the x-intercept ($I_{BL1}=0$) can each be adjusted independently.

Figure 6:
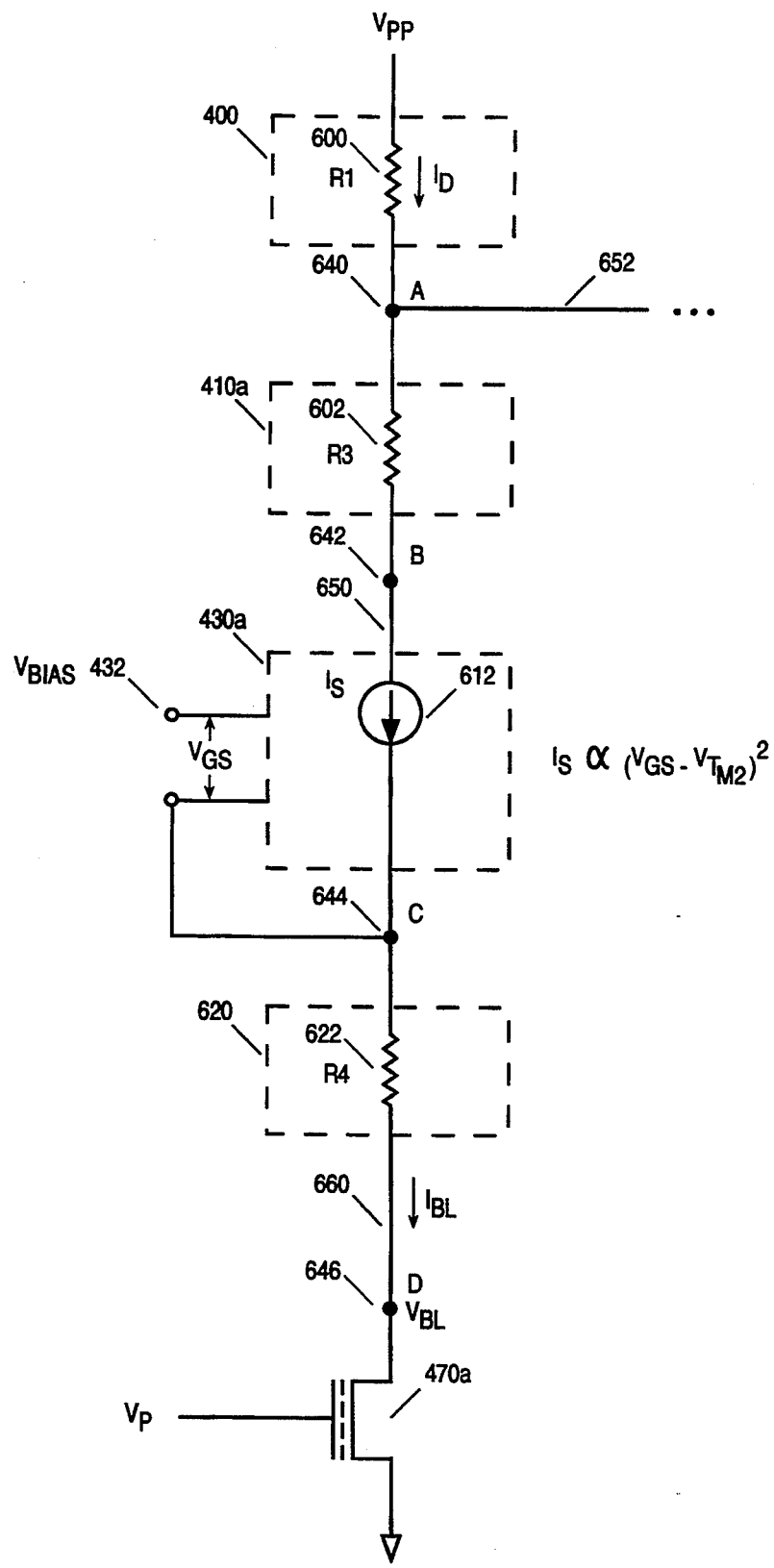
FIG. 6 illustrates one equivalent circuit model for the circuitry providing a dual slope current-voltage characteristic during a memory programming operation.
Figure 7:
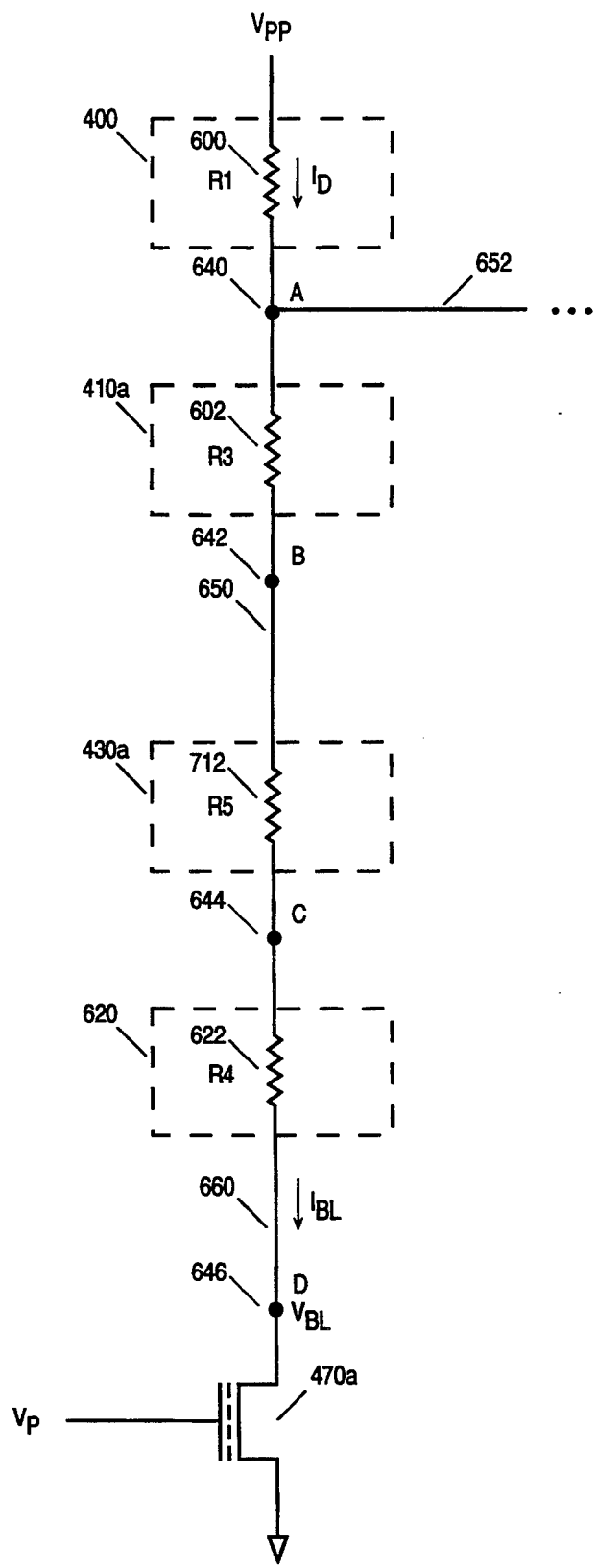
FIG. 7 illustrates another equivalent circuit model for the circuitry providing a dual slope current-voltage characteristic during a memory programming operation.

FIGS. 6 and 7 are schematics used to analyze the operation of the programming load line circuit during a programming operation. FIG. 6 illustrates an equivalent circuit model for the programming circuitry of FIG. 4 for one programming load line 420a and selected bit line 444a which provides a dual slope current voltage characteristic during a memory programming operation of a memory cell 470a. As discussed previously, transistor M1 400 of FIG. 4 serves to limit current to the entire memory array. Transistor M1 400 is modeled as resistor R1 600 in FIGS. 6 and 7. Transistor M3 410a of FIG. 4 is likewise operating in a linear mode, thus transistor M3 410a is modeled as resistor R3 602 in FIGS. 6 and 7. Transistor M2 430a of FIG. 4 is operating in the saturation mode, so transistor M2 430a is modeled as a current source $I_s$ 612. The current $I_s$ 612 is determined by the $V_{BIAS}$ 432 voltage and the source C 644 voltage according to the MOSFET saturation equation: $I_s = K(V_{GS}-V_{tM2})^2$ where $V_{tM2}$ is the MOS transistor threshold voltage, $V_{GS}$ is the $V_{BIAS}$ voltage minus the source C 644 voltage, and K is a constant determined by manufacturing process and the length and width of the transistor. This produces a current-voltage characteristic that drops sharply as the source C approaches the value $V_{BIAS}-V_{tm2}$. Since the select transistors 440a and 480a associated with the selected bit line 444a are operating in the linear mode, the select transistors of FIG. 4 (identified collectively in FIG. 6 as 620) are collectively modeled as a resistor R4 622 in FIGS. 6 and 7.

Referring to FIG. 5, the load-line intersects the x-axis at 112; at this point $V_{BL1}=V_{BIAS}-V_{tM2}$, and $I_S=0$ since transistor 430a is biased off. As the cell 470a draws current from the load-line circuit $V_{BL}$ 646 drops below $V_{BIAS}=V_{BIAS}-V_{tm2}$, and $I_{BL}$ 660 increases rapidly as transistor 430a turns on. This steep current-voltage characteristic provides the voltage limiting effect that keeps the load-line to the left of the drain disturb constraint 110 in FIG. 5. Because the voltage drop across R3 is still small, the drain 642 of transistor M2 430a remains above the voltage $V_{BIAS}-V_{tM2}$. This keeps M2 430a in the saturation region, where the slope of the load line 504 is determined by the transconductance of transistor M2 430a and by the select devices modeled as R4 622. Transistor M2 430a is effectively a voltage source with series resistance.

As $I_{BL}$ continues to increase, the increasing voltage drop across R3 eventually causes the voltage at node B ($V_B$) to fall below the voltage on the gate of M2 ($V_{bias}$—shown in FIG. 4) less the threshold voltage $V_{tM2}$. Once $V_B < V_{bias} - V_{tM2}$, transistor M2 430a switches from operating in the saturation mode to operating in the linear mode. Transistor M2 430a no longer acts as a voltage source. Instead, transistor M2 now acts as a resistor which has a resistance proportional to the channel resistance of transistor M2.

FIG. 7 illustrates an equivalent circuit model for the circuitry providing a dual slope current-voltage characteristic when transistor M2 is operating in the linear mode. Since transistor M2 430a is now operating in the linear mode it has been modeled as resistor R5 712. Further increases in the programming load line current $I_{BL}$ (shown in FIG. 7) cause the voltages at nodes A, B, C, and D to drop proportionally to the effective resistance of R1, R3, R5, and R4 respectively. The resistance R3 602 will introduce a change in the slope of the current-voltage characteristic. R3 is designed to have the highest resistance relative to R1, R5, and R4 so that R3 predominately determines the slope of the curve in the upper region 502 of the characteristic curves as shown in the one memory cell characteristic curve 304a of FIG. 5. The point 500 at which the slope changes is controlled by $V_{bias}$ on the gate of transistor M2 430a and by $V_p$ on the gate of transistor M3 410a (shown in FIG. 4) and the sizes of transistors M2 430a and M3 410a. Thus a memory designer has full control of the slope of the curve in the upper region 502, the slope of the curve in the lower region 504, the point 500 at which the slope changes, and the x intercept 112. The designer chooses the appropriate gate width and length for transistor M3 to control the resistance (R3) of M3 while operating in the linear mode. This resistance R3 602 controls the slope of the curve in the upper region 502. The designer may choose the transconductance (thus the resistance R2 614) of transistor M2 430a to control the slope of the curve in the lower region 504. Finally, the designer may select the bias voltage $V_{bias}$ applied to the gate of transistor M2 430a which, along with the sizes of transistors M2 430a and M3 410a, controls the point 500 at which the slope changes. The final choice of bias voltage $V_{Bias}$ also determines the intersection of the characteristic curve (for example curve 304a in FIG. 5) with the x-axis point 112. The voltage at this point is limited to $V_{Bias} - V_{tM2}$, the turn off voltage of M2 430a.

Figure 8:
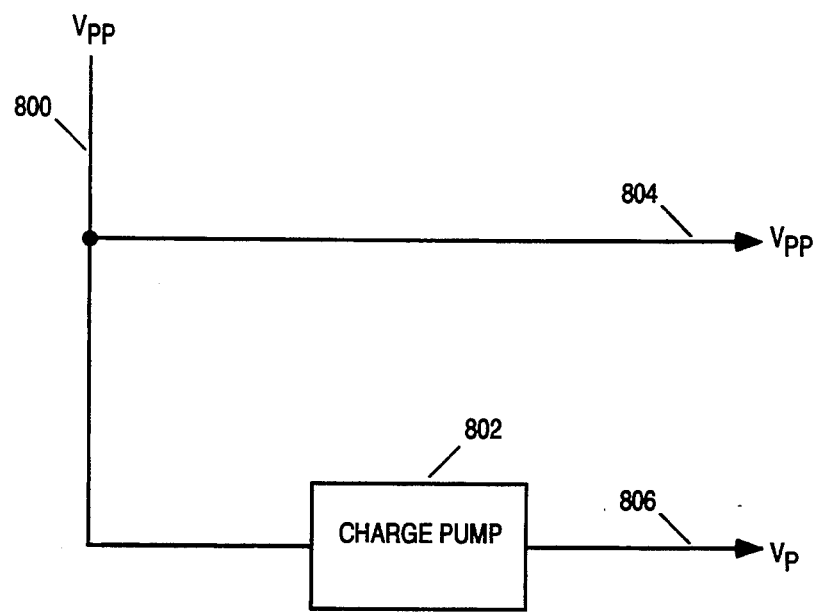
FIG. 8 is a block diagram indicating one way to obtain a selection voltage potential for use during the memory programming operation from one source.

FIG. 8 illustrates a method of obtaining the select voltage $V_p$ from the programming voltage $V_{pp}$. The programming voltage $V_{pp}$ is coupled to the input 800 of a charge pump 802. The select voltage $V_p$ is obtained from the output 806 of the charge pump 802. The construction and operation of a charge pump 802 is well known in the art.

Figure 9:
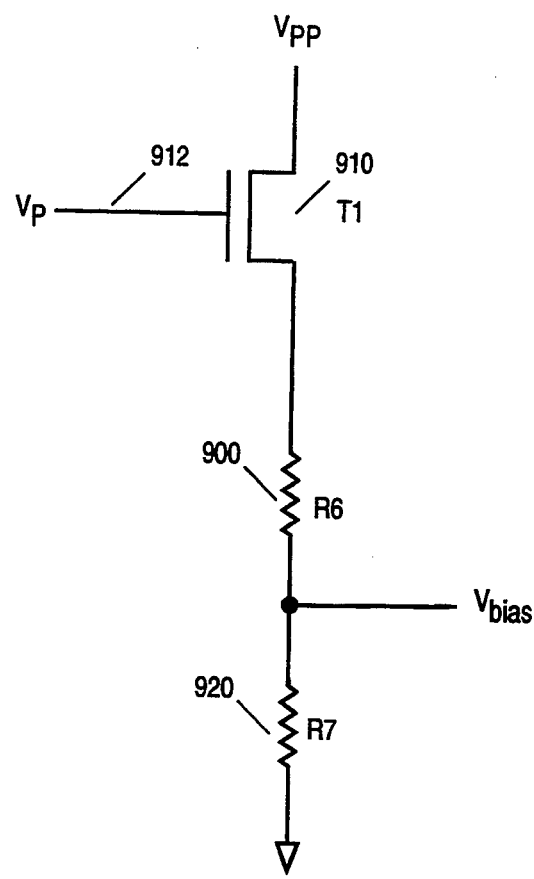
FIG. 9 is a schematic indicating one way to obtain a bias voltage potential for use by the memory programming circuitry.

FIG. 9 illustrates one embodiment of a circuit for obtaining the bias voltage $V_{bias}$ from the programming voltage source $V_{pp}$. In the preferred embodiment, $V_{bias}$ is approximately +10 volts. $V_p$ is typically +15 volts, and $V_{pp}$ is preferably +12.5 +0.5 volts.

Transistor T1 910 serves primarily as a switch. During the programming operation the selection voltage $V_p$ is applied to the gate 912 of transistor T1 910 thus turning transistor T1 910 on and permitting current flow through resistors R6 900 and R7 920. Transistor T1 910 is preferably an n-channel MOSFET.

During a programming operation $V_p$ turns on transistor T1 910 permitting current flow through the voltage divider resistors R6 900 and R7 920 which have a resistance ratio such that $V_{Bias}$ is approximately +10 volts.

In the foregoing specification the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

I claim:

1. A nonvolatile memory comprising:
    (a) a memory array that includes a first memory cell coupled to a first bit line, a second memory cell coupled to a second bit line, wherein the first memory cell receives a first current during programming of the first memory cell, wherein the second memory cell receives a second current during programming of the second memory cell;
    (b) current regulating circuitry coupled to the array, the circuitry regulating the current-voltage characteristic of the first and second currents during programming of the first and second memory cells, wherein when the first cell is being programmed and the second cell is not being programmed the circuitry controls the current-voltage characteristic of the first current flowing through the first bit-line for programming of the first memory cell to be substantially equivalent to the current-voltage characteristic of the first current if the first and second memory cells are being programmed substantially at the same time.

2. The circuitry of claim 1 wherein the circuitry further comprises:
    a current regulating means having a first terminal and being coupled to a programming voltage source;
    a voltage limiting means coupled to the current regulating means at a second terminal and coupled to the first memory cell at a third terminal, wherein the current regulating means provides a regulating voltage at the second terminal in response to the first current and does not permit the first current to substantially exceed a maximum first bit-line current; wherein the voltage limiting means reduces the first current when the first bit line voltage exceeds a maximum first bit line voltage.

3. The circuitry of claim 2 wherein:
    (a) the current regulating means is a first transistor having a drain region, a control gate and a source region, wherein the drain region forms the first terminal, the source region forms the second terminal, the control gate is coupled to a selection voltage source, wherein the selection voltage source provides a selection voltage when the first memory cell is selected for programming;
    (b) the voltage limiting means is a second transistor having a drain region, a control gate, and a source region, wherein the drain region of the second transistor is coupled to the second terminal, the source region of the second transistor forms the third terminal, the control gate of the second transistor is coupled to a biasing voltage source at a bias terminal.

4. The voltage limiting means in claim 3 wherein the biasing voltage source is provided by a voltage divider network coupled to the programming voltage source.

5. The circuitry of claim 4, wherein the first memory cell is selectively coupled to the first bit line and the second memory cell is selectively coupled to the second bit line such that the first memory cell and the second memory cell can be selected for programming.

6. The circuitry of claim 5, wherein the first memory cell and the second memory cell can be selected by the selection voltage source.

7. The circuitry of claim 3 wherein the first transistor and the second transistor are n-channel MOSFETs.

8. A nonvolatile memory comprising:
(a) a memory array that includes a first memory cell coupled to a first bit line, a second memory cell coupled to a second bit line, a third memory cell coupled to a third bit line, and a fourth memory cell coupled to a fourth bit line, the memory array further comprising a first programming load line circuit and a second programming load line circuit, wherein the first load line circuit is selectively coupled to the first bit line and the second bit line such that at most one of the first and second bit lines can be selected for programming, wherein the second programming load line circuit is selectively coupled to the third and fourth bit lines such that at most one of the third and fourth bit lines can be selected for programming, wherein the first memory cell receives a first current during programming of the first memory cell, wherein the second memory cell receives a second current during programming of the second memory cell, the third memory cell receives a third current during programming of the third memory cell, the fourth memory cell receives a fourth current during programming of the fourth memory cell;
(b) a first current regulating circuitry coupled to the first programming load line and a second current regulating circuitry coupled to the second programming load line, the first and second current regulating circuitry regulating the first, second, third and fourth currents during programming of the first, second, third and fourth memory cells, wherein when the first cell is being programmed and the third and fourth cells are not being programmed the circuitry limits a first programming load line current flowing through the first programming load line to be substantially equivalent to the first programming load line current if the first and third memory cells are being programmed substantially at the same time.

9. A method of regulating a first current in a first memory cell of a nonvolatile memory during programming of the first memory cell wherein the memory comprises at least the first memory cell and a second memory cell, wherein the first memory cell is coupled to a first bit line and the second memory cell is coupled to a second bit line, comprising the steps of:
generating a regulating voltage proportional to the first current;
applying the, regulating voltage to a current control circuitry, wherein the current control circuitry is coupled to a programming voltage source at a first terminal and coupled to the first bit line at a second terminal;
wherein the current control circuitry controls the first current in response to the regulating voltage so that the first current when the first memory cell is being programmed and the second memory cell is not being programmed is substantially equivalent to the first current when the first memory cell and the second memory cell are being programmed at substantially the same time.

10. The method of claim 9 wherein the current control circuitry comprises a first MOSFET having a drain, a source and a gate, wherein the source is coupled to the first bit line, the gate is coupled to a bias voltage and the drain is coupled to a current regulating voltage source.

11. The method of claim 10 wherein the regulating voltage is generated from the current regulating voltage source by a current regulating MOSFET having a drain, a source and a gate, wherein the drain of the current regulating MOSFET is coupled to the programming voltage source, the source of the current regulating MOSFET is coupled to the drain of the first MOSFET, the gate of the current regulating MOSFET is coupled to a select voltage, wherein the regulating voltage is provided at the source of the current regulating MOSFET.

12. A nonvolatile memory comprising:
(a) a memory army that includes a first memory cell coupled to a first bit line, a second memory cell coupled to a second bit line, wherein the first memory cell receives a first current during programming of the first memory cell, wherein the second memory cell receives a second current during programming of the second memory cell, wherein the first memory cell has a first programming voltage when receiving the first current, wherein the second memory cell has a second programming voltage when receiving the second current;
(b) current regulating circuitry coupled to the array, the circuitry regulating the first and second currents during programming of the first and second memory cells, wherein when the first cell is being programmed and the second cell is not being programmed the circuitry limits the first current flowing through the first bit line for programming the first memory cell to be substantially equivalent to the first current if the first and second memory cells are being programmed substantially at the same time, wherein the current regulating circuitry regulates a first programming voltage-to-first current ratio such that the ratio has a first value when the first programming voltage is between a first potential level and a second potential level and a second value when the first programming voltage is between the second potential level and a third potential level, wherein the first value is substantially not equal to the second value.

13. A nonvolatile memory as in claim 12 wherein said first and said second values may be adjusted independently.

14. A nonvolatile memory as in claim 13 wherein said current regulating circuitry comprises a first and a second device and wherein modifying said first device causes an adjustment of said first value and wherein modifying said second device causes an adjustment of said second value.

15. A nonvolatile memory as in claim 14 wherein said first device has a first resistance in a first mode which first resistance may be adjusted to cause an adjustment of said first value.

16. A nonvolatile memory as in claim 15 wherein said second device has a first transconductance which may be adjusted to cause an adjustment of said second value.

17. A nonvolatile memory as in claim 16 wherein said first device is a MOSFET and said second device is a MOSFET.

* * * * *